United States Patent [19]

Flowers

[11] Patent Number: 4,692,991

[45] Date of Patent: Sep. 15, 1987

[54] METHOD OF CONTROLLING FORWARD VOLTAGE ACROSS SCHOTTKY DIODE

[75] Inventor: Ronald C. Flowers, Sandy, Utah

[73] Assignee: Signetics Corporation, Sunnyvale, Calif.

[21] Appl. No.: 757,038

[22] Filed: Jul. 19, 1985

[51] Int. Cl.$^4$ ............................................. H01L 29/48
[52] U.S. Cl. ...................... 437/175; 148/DIG. 140; 148/DIG. 139; 427/124; 357/15; 437/187
[58] Field of Search .................... 427/84, 88, 90, 51, 427/124, 125; 148/DIG. 140, DIG. 139; 29/569 R, 590

[56] References Cited

U.S. PATENT DOCUMENTS

| | | | |
|---|---|---|---|
| 4,056,642 | 11/1977 | Saxena et al. | 427/84 |
| 4,211,587 | 7/1980 | Massies et al. | 148/187 |
| 4,310,568 | 1/1982 | Howard et al. | 427/84 |
| 4,313,971 | 2/1982 | Wheatley, Jr. | 427/84 |
| 4,357,178 | 11/1982 | Bergeron et al. | 148/1.5 |
| 4,379,832 | 4/1983 | Dalal et al. | 427/84 |
| 4,443,808 | 4/1984 | Kihara et al. | 357/15 |

OTHER PUBLICATIONS

Ashok et al., "Effect of Low Energy Ar+ Ion Implantation on Silicon Surface Barriers," *Thin Solid Films*, 126 (Apr. 26, 1985), pp. 251–256.

Hecht, "Contact Resistance Response Surface ...," *J. Vac. Sci. Technol.*, 16, No. 2, 1979, pp. 328–330.

Iyer et al., "Ambient Gas Effects on the Reaction of Titanium with Silicon," *J. Electrochem. Soc.*, 132, No. 9, Sep. 1985, pp. 2240–2245.

*Primary Examiner*—Olik Chaudhuri
*Attorney, Agent, or Firm*—R. J. Meetin; J. Oisher; T. Briody

[57] ABSTRACT

During the deposition of a metallic layer on an N-type semiconductive region to form a Schottky diode in a structure placed in a highly evacuated chamber, at least one selected gas is introduced into the chamber to control the forward voltage across the diode.

14 Claims, 3 Drawing Figures

METHOD OF CONTROLLING FORWARD VOLTAGE ACROSS SCHOTTKY DIODE

FIELD OF USE

This invention relates to methods for controlling the forward voltage across a Schottky diode consisting of an N-type semiconductor and a metallic layer such as aluminum.

BACKGROUND ART

Metal-semiconductor rectifying elements, usually referred to as Schottky diodes, are used extensively in bipolar integrated circuits (IC's). In making a Schottky diode, a partly finished IC having an N-type semiconductive region that acts as the cathode is typically placed in a deposition chamber whose pressure is reduced to a very low level. A metal or metallic alloy is evaporatively deposited on the N-type region. The resulting metallic layer is then selectively etched to divide it into a number of separated segments. One of these is the anode that forms a rectifying junction with a portion of the N-type region. Another of the metallic segments is the cathode contact which ohmically adjoins another portion of the N-type region more highly doped than the first-mentioned portion.

The voltage $V_F$ between the anode and the cathode contact when the rectifying junction is forwardly conductive characterizes a Schottky diode for many applications. Muller et al, *Device Electronics for Integrated Circuits* (John Wiley & Sons, New York: 1977), Chap. 2, discusses various factors that affect $V_F$. For example, $V_F$ differs from one metal or metal-like substance to another. The net concentration of the N-type dopant on the semiconductive side of the rectifying junction affects the forward voltage. These factors provide wide latitude in selecting materials to optimize $V_F$.

For some types of Schottky diodes such as aluminum-silicon Schottkies, $V_F$ at a particular diode location in an IC often differs significantly from IC's processed together in one batch to IC's processed together in another batch. This variation is usually undesirable. It can lead to markedly reduced performance or device failure. Attempts to minimize $V_F$ variation by keeping the metal deposition system clean have had only marginal success with aluminum-silicon Schottky diodes. For such types of Schottkies, it is desirable to ascertain processing factors that influence the forward voltage so that its value can be better controlled from IC to IC.

DISCLOSURE OF THE INVENTION

This invention is based on the discovery that the presence/absence of certain gases such as oxygen, argon, and nitrogen during low-pressure deposition of a metal such as aluminum on a semiconductor to form a Schottky diode influences its forward voltage. In particular, a metallic layer is deposited on an N-type semiconductive region of a structure placed in a highly evacuated chamber to form a Schottky rectifying junction between a first portion of the N-type region and a segment of the metallic layer. During the deposition step, at least one selected gas is introduced into the chamber to control the voltage $V_F$ between the metallic segment and an electrical conductor that is created to ohmically contact a second portion of the N-type region.

The deposition step is preferably done by evaporative techniques at an initial chamber pressure no greater than $10^{-5}$ torr. If, for example, the metallic layer is substantially aluminum while the N-type region is silicon, injection of oxygen or argon into the chamber causes $V_F$ to increase. On the other hand, introduction of nitrogen leads to a decrease in the forward voltage.

BRIEF DESCRIPTION OF THE DRAWINGS

Like reference symbols are used in the drawings and in the description of the preferred embodiment to represent the same or very similar item or items.

DESCRIPTION OF THE PREFERRED EMBODIMENTS

In the present invention, the forward voltage of $V_F$ across a Schottky diode is controlled by introducing one or more gases into the vicinity of the rectifying junction during low-pressure evaporative deposition of a metallic layer on an N-type semiconductor to form the junction. The semiconductor is preferably silicon. Alternatives include germanium, gallium arsenide, gallium phosphide, and other mixed Group III–V compounds. Aluminum is preferred for the metalic layer. Further candidates include copper, gold, silver, nickel, palladium, platinum, chromium, molybdenum, tungsten, titanium, and iridium. These metals may be used separately or as alloys in various combinations with one another and/or other materials such as silicon. The metallic layer might also consist of a metal-like compound such as a deposited metal silicide.

Figure 1:
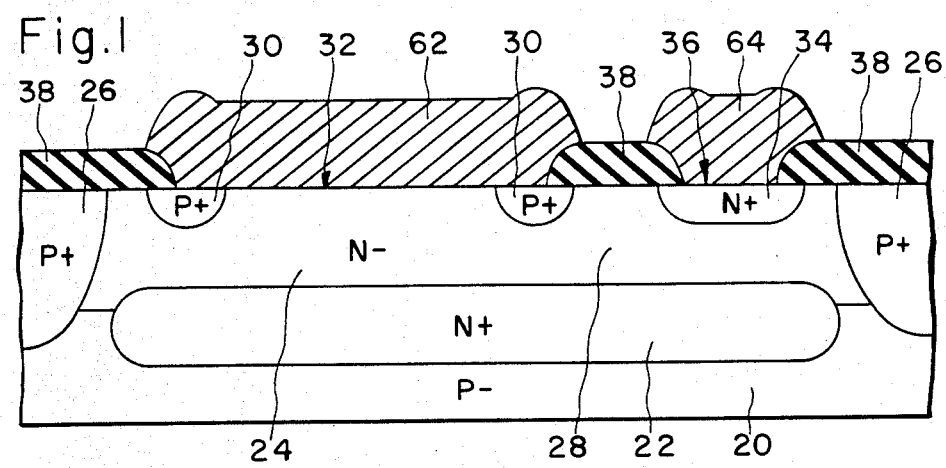
FIG. 1 is a cross-sectional side view of a structure for a Schottky diode manufactured in accordance with the invention.

Referring to the drawings, FIG. 1 shows an embodiment of a guard-ring Schottky diode fabricated in accordance with the invention. The following discussion illustrates how $V_F$ for this diode is controlled during fabrication. Unless otherwise indicated, the various manufacturing steps are performed at room temperature (about 25° C.) and atmospheric pressure. Conventional masking and cleaning steps are employed in creating the various doped and metallic regions. References to these steps and to other such well known steps are generally omitted from the following discussion.

The starting material is a boron-doped P− monocrystalline silicon substrate 20 into which arsenic is selectively diffused at the general location for a buried region 22. After exposing the top of substrate 20, an arsenic-doped N− layer 24 is epitaxially grown on the upper substrate surface. The net average dopant concentration of epitaxial layer 24 is no greater than $2 \times 10^{17}$ atoms/cm$^3$ (0.05 ohm-cm) so that the diode junction will be rectifying rather than ohmic (or non-rectifying). The net dopant concentration of layer 24 is preferably $1.4 \times 10^{16}$ atoms/cm$^3$ (0.45 ohm-cm). During epitaxial growth and subsequent processing, the arsenic suitably redistributes to form highly doped N+ buried region 22 at a sheet resistance of about 800 ohms/square.

A layer of silicon dioxide is thermally grown along the top of the structure. After opening a suitable window through this oxide layer, boron is diffused in through the window to form a highly doped annular P+ region 26 extending into substrate 20. P+ region 26 laterally surrounds an active semiconductor portion 28 of N− layer 24 in such a manner as to laterally electrically isolate portion 28 from other such active semiconductor portions in a wafer containing the structure.

Silicon dioxide is thermally grown on the top of the structure to close the window after which a new window is opened in the resulting oxide layer. Boron is diffused in through the new window to form a shallow highly doped P+ guard ring 30 that laterally surrounds the intended location for a rectifying junction 32. The steps of oxide growth, new window opening, and diffusion are repeated with phosphorous to form a shallow highly doped N+ portion 34 generally at the intended location for an ohmic junction 36 to the cathode contact for the diode. N+ plug 34 has a net N-type dopant concentration of about $5 \times 10^{21}$ atoms/cm$^3$ (10 ohms/square). More silicon dioxide is thermally grown to close the window for plug 34. Layer 38 is the resulting oxide layer that adjoins active region 28.

Next windows are opened through oxide layer 38 at the sites for junctions 32 and 36. The window for rectifying junction 32 extends over the inside upper periphery of guard ring 30. The structure is cleaned after which any silicon dioxide remaining in the windows is etched away.

Figure 2:
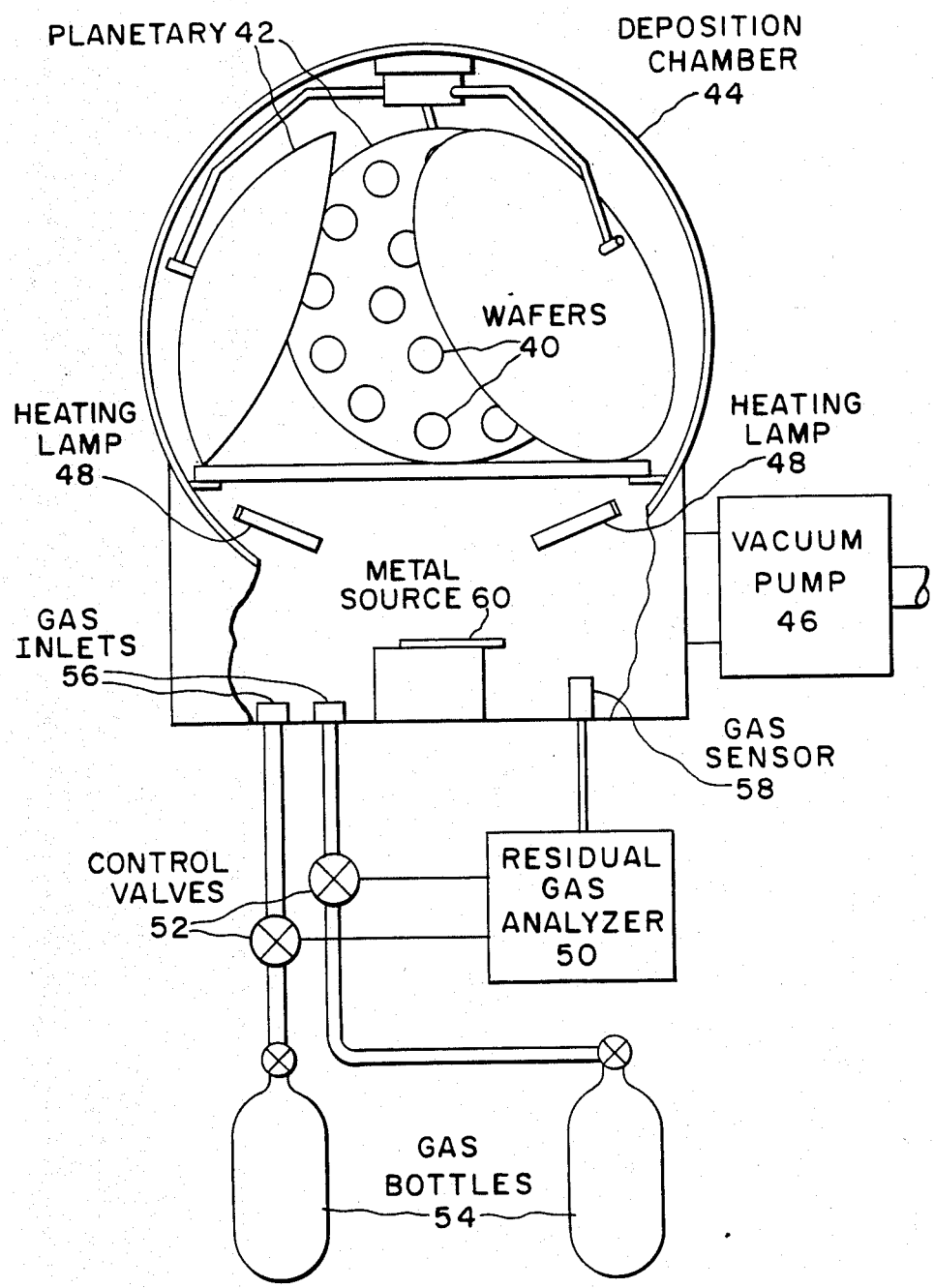
FIG. 2 is a schematic/block diagram of an evaporative deposition apparatus used in making the diode of FIG. 1.

The wafer containing the structure is now put into a metal deposition apparatus shown in FIG. 2. In particular, the wafer is one of wafers 40 placed on a planetary 42 in a deposition chamber 44 of the apparatus. A vacuum pump 46 is activated to reduce the pressure in chamber 44 to at least $10^{-5}$ torr. The chamber pressure is preferably reduced to about $5 \times 10^{-7}$ torr. Heating lamps 48 set the temperature in chamber 44 at a value from room temperature to about 450° C.. The chamber temperature is preferably 150° C..

After planetary 42 starts rotating, a residual gas analyzer 50 activates one of control valves 52 to enable a small flow of a selected gas from one of gas bottles 54 to enter chamber 44 through the associated one of gas inlets 56. During the gas injection and metal deposition, vacuum pump 46 continues running so as to maintain an operating pressure of about $10^{-6}$ torr in chamber 44. Gas analyzer 50 measures the partial pressure of the selected gas utilizing a sensor 58 located in chamber 44. This feedback loop enables analyzer 50 to adjust the flow rate of the selected gas to the value necessary to achieve a desired partial pressure.

An electron-beam unit in a metal source 60 heats up a melt source of substantially pure aluminum to cause Al atoms to vaporize. After analyzer 50 has established the desired partial pressure for the gas, a shutter in metal source 60 is opened. Al atoms evaporatively deposit on the upper surface of the structure in FIG. 1 to form junctions 32 and 36. When an aluminum thickness of 0.6–0.8 micron is reached, the shutter is closed to turn off source 60. Subsequently, the activated valve 52 is turned off to stop the gas injection. Wafers 40 are removed from chamber 44 after venting to atmospheric pressure.

The aluminum layer is then selectively etched to produce aluminum segments 62 and 64. Al segment 62 is the anode for the Schottky diode. Al segment 64 is the external contact to the cathode which generally consists of the N-type portion of active region 28. When the diode is forwardly conductive, (positive) current from anode 62 travels downward across junction 32, through the underlying part of active region 28, along buried region 22, and upward through highly doped portion 34 to cathode contact 64. $V_F$ is the voltage between anode 62 and contact 64. The area of junction 32 is about 500 micron$^2$.

Oxygen, argon, and nitrogen have been examined as the gas injected into chamber 44 during Al deposition. The table below shows how injection of one of these gases causes $V_F$ to vary at a constant current $I_D$ flowing through rectifying junction 32 when it is forward biased.

|   | Injected Gas | $I_D = 10$ microamp. $V_F$ (mv) | $\frac{\Delta V_F}{V_{F0}}$ | $I_D = 1$ milliamp. $V_F$ (mv) | $\frac{\Delta V_F}{V_{F0}}$ |
|---|---|---|---|---|---|
| A | None | 319 |  | 504 |  |
|   | Oxygen | 361 | 13% | 581 | 15% |
| B | None | 332 |  | 533 |  |
|   | Oxygen ($\frac{1}{2}$ of A) | 350 | 5% | 570 | 7% |
| C | None | 286 |  | 466 |  |
|   | Argon | 296 | 3% | 486 | 4% |
| D | None | 333 |  | 529 |  |
|   | Nitrogen | 316 | −5% | 507 | −4% |

The $V_F$ numbers in this table are average values. $V_{FO}$ is the value of $V_F$ when no gas is injected. $\Delta V_F$ is the difference between $V_{FO}$ and the value of $V_F$ when a particular one of the gases is introduced into chamber 44 during Al deposition. For each set of tests A, B, C, and D, Schottky diodes of the foregoing type were examined on six wafers processed together except for the Al deposition/gas injection. Three were subjected to gas injection, while the remaining three were processed without gas injection to serve as the $V_{FO}$ baseline. The oxygen partial pressure in set B for the three wafers processed with gas injection was about one half that for set A.

The table shows that $V_F$ increases when oxygen or argon is introduced into chamber 44 during aluminum deposition. The opposite is true with nitrogen. It appears that the $V_F$ differences are due substantially to the gas injection that occurs during deposition of the first few monolayers of aluminum atoms.

Figure 3:
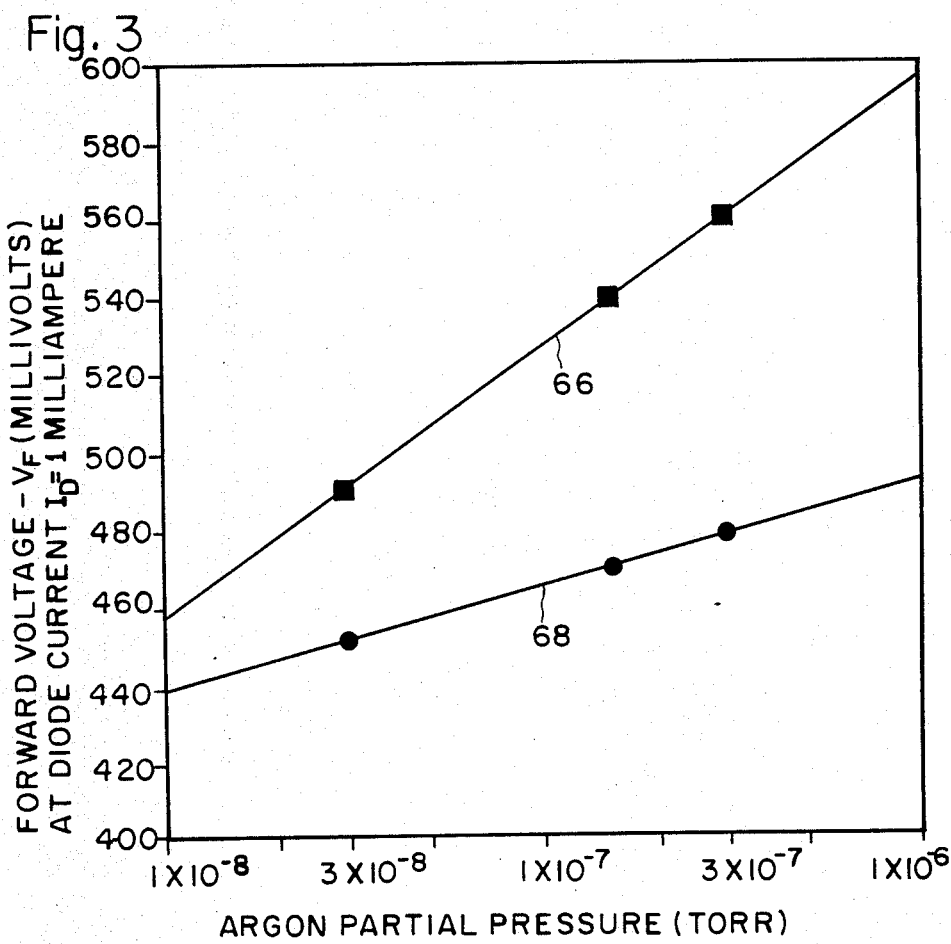
FIG. 3 is a graph of forward voltage as a function of argon partial pressure for the Schottky diode of FIG. 1.

Further tests were done to determine how $V_F$ varies with the partial pressure of argon for Schottky diodes of the preceding type. FIG. 3 displays the results at the higher $I_D$ level. Curve 66 shows the changes in $V_F$ when it was measured directly after the selective etching to create Al segments 62 and 64 of wafers. These wafers were subsequently completed in a conventional manner. The thermal cycling that occurred during the final processing steps caused the forward voltage to drop, as shown by curve 68 which illustrates the changes in $V_F$ when measured after final processing. Curves 66 and 68 both indicate that $V_F$ increases nearly logarithmically with increasing argon partial pressure.

Similar graphs can be prepared for oxygen and nitrogen. Suitable choice for the injected gas and its partial pressure therefore allows $V_F$ to be optimized for particular applications.

While the invention has been described with reference to particular embodiments, this description is solely for the purpose of illustration and is not to be construed as limiting the scope of the invention claimed below. For example, the gas flow for the selected gas could be turned off before the end of the metal deposition step. Two or more gases could be simultaneously introduced into the deposition chamber during metal deposition. Thus, various modifications and applications may be made by those skilled in the art without departing from the true scope and spirit of the invention as defined by the appended claims.

What is claimed is:

1. A method wherein a metallic layer is deposited on an N-type semiconductive region of a structure placed in a highly evacuated chamber to form a rectifying junction between a first portion of the N-type region and a segment of the metallic layer; and an electrical conductor is created to ohmically contact a second portion of the N-type region; characterized by the step of introducing at least one gas into the chamber during the deposition step in order to control the voltage $V_F$ between the metallic segment and the conductor when the rectifying junction is forwardly conductive.

2. A method as in claim 1 characterized by the step of evacuating the chamber to a pressure no greater than $10^{-5}$ torr before the gas introduction and deposition steps.

3. A method as in claim 2 characterized in that the gas introduction step is started before the deposition step.

4. A method as in claim 3 characterized in that the gas introduction step is performed during deposition of at least the first few atomic monolayers of the metallic layer.

5. A method as in claim 3 wherein: the metallic layer consists substantially of aluminum; and the N-type region consists substantially of doped monocrystalline silicon; characterized in that $V_F$ decreases at constant current through the rectifying junction where the gas introduction step consists substantially of introducing nitrogen into the chamber.

6. A method as in claim 1 characterized in that the gas introduction step consists substantially of introducing at least one of oxygen, nitrogen, and argon into the chamber.

7. A method as in claim 6 characterized in that the pressure in the chamber is on the order of $10^{-6}$ torr during the deposition step.

8. A method as in claim 3 wherein: the second portion is more highly doped than the first portion; the deposition step comprises evaporatively depositing atoms of the metallic layer on the N-type region; and the metallic layer is selectively etched to divide it into a plurality of separated parts of which two are the segment and the conductor; characterized in that the metallic layer comprises at least one of aluminum, copper, gold, silver, nickel, palladium, platinum, chromium, molybdenum, tungsten, titanium, and iridium.

9. A method as in claim 3 wherein: the metallic layer consists substantially of aluminum; and the N-type region consists substantially of doped monocrystalline silicon; characterized in that $V_F$ increases at constant current through the rectifying junction where the gas introduction step consists substantially of introducing oxygen or argon into the chamber.

10. A method wherein a metallic layer consisting substantially of aluminum is physically deposited on an N-type semiconductive region of a structure placed in a highly evacuated chamber to form a rectifying junction between a first portion of the N-type region and a segment of the layer; and an electrical conductor is created to ohmically contact a second portion of the N-type region; characterized by the step of introducing at least one gas into the chamber during at least the beginning of deposition step in order to control the voltage $V_F$ between the segment and the conductor when the rectifying junction is forwardly conductive.

11. A method as in claim 10 wherein the deposition step comprises evaporatively depositing atoms of the layer on the N-type region, characterized by the step of evacuating the chamber to a pressure no greater than $10^{-5}$ torr before the gas introduction and deposition steps.

12. A method as in claim 11 wherein the N-type region consists substantially of doped monocrystalline silicon, characterized in that $V_F$ decreases at constant current through the rectifying junction where the gas introduction step consists substantially of introducing nitrogen into the chamber.

13. A method as in claim 11 characterized in that the gas introduction step consists substantially of introducing at least one of oxygen, nitrogen, and argon into the chamber.

14. A method as in claim 11 wherein the N-type region consists substantially of doped monocrystalline silicon, characterized in that $V_F$ increases at constant current through the rectifying junction where the gas introduction step consists substantially of introducing oxygen or argon into the chamber.

* * * * *